(12) United States Patent
Pelicia et al.

(10) Patent No.: US 10,763,846 B1
(45) Date of Patent: Sep. 1, 2020

(54) HIGH VOLTAGE TOLERANT ANALOG SWITCH

(71) Applicant: NXP USA, INC., Austin, TX (US)

(72) Inventors: Marcos Mauricio Pelicia, Campinas (BR); Ivan Carlos Ribeiro do Nascimento, Campinas (BR); Bruno Bastos Cardoso, Rio de Janeiro (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/549,873

(22) Filed: Aug. 23, 2019

(51) Int. Cl.
*H03K 17/10* (2006.01)
*H03K 17/56* (2006.01)

(52) U.S. Cl.
CPC ............ *H03K 17/10* (2013.01); *H03K 17/56* (2013.01)

(58) Field of Classification Search
None
See application file for complete search history.

(56) References Cited

U.S. PATENT DOCUMENTS

| | | | |
|---|---|---|---|
| 5,446,303 A | 8/1995 | Quill et al. | |
| 6,400,189 B2* | 6/2002 | McDaniel | H03K 19/00315 326/83 |
| 7,394,305 B2 | 7/2008 | Fu et al. | |
| 8,008,951 B2 | 8/2011 | Isik | |
| 8,054,122 B2* | 11/2011 | Guo | H03K 17/145 327/333 |
| 8,289,066 B2* | 10/2012 | Guo | H03K 17/04123 327/419 |
| 8,354,873 B2* | 1/2013 | Ono | H03K 17/164 327/391 |
| 8,698,546 B1* | 4/2014 | Mishra | H03K 17/6871 327/388 |
| 9,094,008 B2 | 7/2015 | Lee | |
| 9,509,305 B2 | 11/2016 | Nascimento et al. | |
| 9,621,156 B2 | 4/2017 | Aherne | |

OTHER PUBLICATIONS

Chhabra, A., "−1.1V to +1.1V 3:1 Power Switch Architecture for Controlling Body Bias of SRAM Array in 28nm UTBB CMOS FDSOI", 29th International Conference on VLSI Design and 2016 15th International Conference on Embedded Systems, 2016.

\* cited by examiner

*Primary Examiner* — Jeffrey S Zweizig (57) ABSTRACT

An analog switch circuit is provided. The circuit includes a branch coupled between an input terminal and an output terminal. The branch is configured to transfer an input signal at the input terminal to the output terminal when a control signal is at a first state. A transistor in the branch includes a current electrode coupled at the input terminal and is configured for receiving the input signal having a voltage exceeding a voltage rating of the transistor. A level shifter includes an output coupled to a control electrode of the transistor and is configured to provide a first voltage sufficient to cause the transistor to be conductive without exceeding the voltage rating of the first transistor when the control signal is at the first state. A voltage generator is coupled to the level shifter and is configured to generate the first voltage based on the input signal.

20 Claims, 5 Drawing Sheets

HIGH VOLTAGE TOLERANT ANALOG SWITCH

BACKGROUND

Field

This disclosure relates generally to electronic circuits, and more specifically, to a high voltage tolerant analog switch circuit.

Related Art

Today, many modern electronic devices incorporate circuitry for receiving analog signals. Such circuits are often required to receive extended voltage range analog signals having maximum voltages extending beyond normal operating voltage ranges of the circuits. However, these circuits may experience excessive leakage currents and excessive impedances when receiving these extended voltage range analog signals. It is thus desirable to provide circuitry that accommodates an extended voltage range of analog signals while minimizing leakage current and impedances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an analog switch circuit with high voltage tolerance and low impedance. The analog switch is characterized as closed when a control signal is at a first logic state and open when the control signal is at a second logic state. The analog switch circuit includes a first branch of series connected N-channel transistors and a second branch of series connected P-channel transistors coupled in parallel with the first branch. A voltage generation circuit generates voltages based on the input voltage signal and in turn, the generated voltages are provided to the transistors of the second branch by way of level shifters based on the control signal. The analog switch circuit circuitry is implemented in a low-voltage process technology and accommodates an input voltage signal up to 2*VDD without exceeding a voltage rating of the transistors (e.g., maximum VGS, VDS) in the first and second branches.

Figure 1:
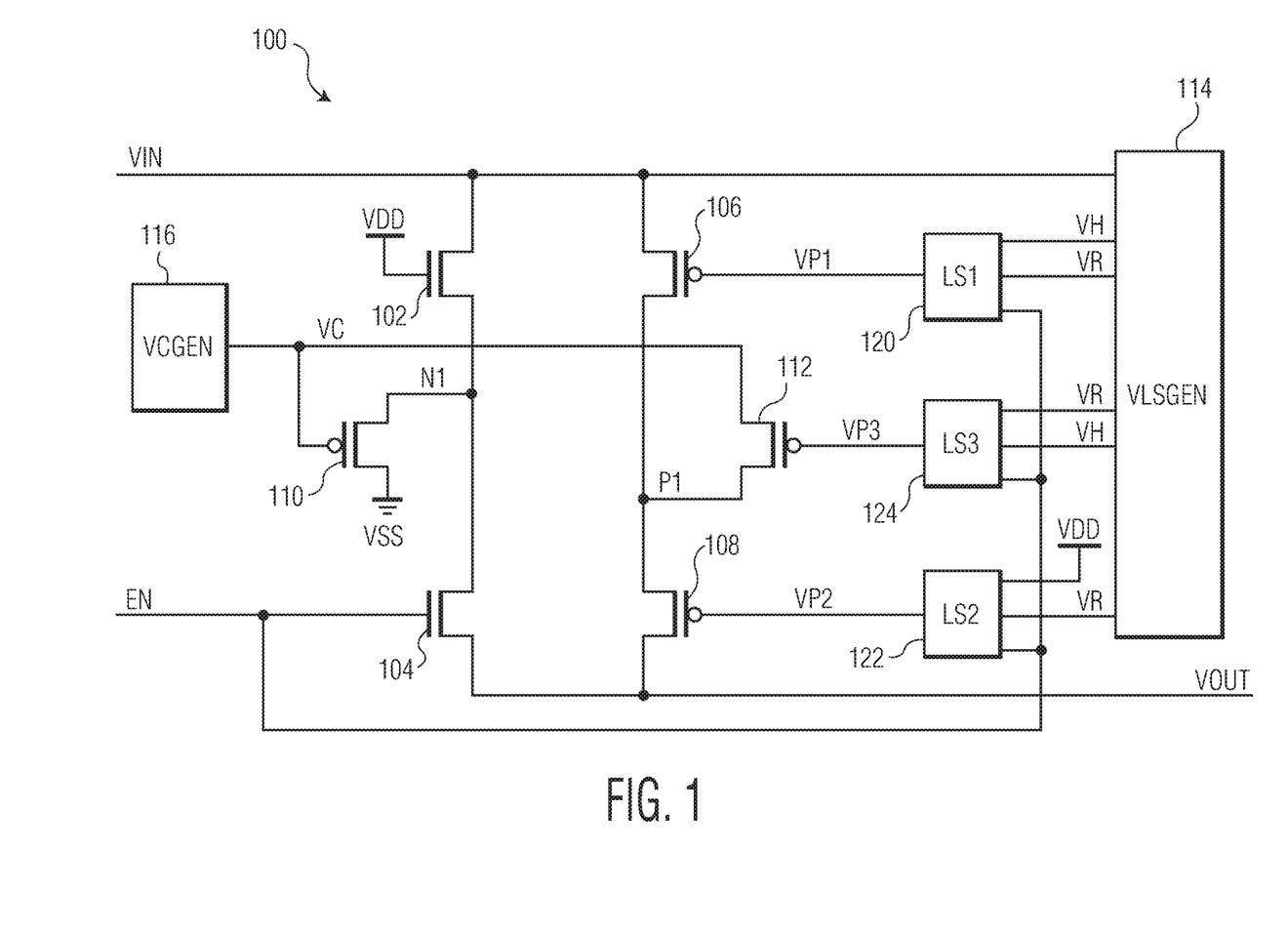
FIG. 1 illustrates, in simplified schematic diagram form, an example analog switch circuit in accordance with an embodiment.

FIG. 1 illustrates, in simplified schematic diagram form, an example analog switch circuit 100 in accordance with an embodiment. Switch circuit 100 is implemented as an integrated circuit and has an input terminal labeled VIN for receiving an analog input signal VIN, an output terminal labeled VOUT for providing an analog output signal VOUT, and an enable input terminal labeled EN for receiving an enable control signal EN. In this embodiment, the example implementation of switch circuit 100 includes transistors 102-112, a level shifter voltage generation circuit block 114, a clamp voltage generation circuit block 116, and level shifters 120-124.

Switch circuit 100 includes circuitry configured and arranged to receive input signals which have voltages exceeding a maximum operating voltage rating (e.g., maximum VGS, VDS) of transistors 102-108 used in the implementation of switch circuit 100 as well as input signals which are within the maximum operating voltage rating. Switch circuit 100 is further configured and arranged to be closed (e.g., conductive) when the control signal EN is at a first state (e.g., logic high) and open (e.g., non-conducive) when the control signal EN is at a second state (e.g., logic low). For example, switch circuit 100 is configured and arranged to receive an analog signal (e.g., VIN) at the VIN terminal and transfer the analog signal to the output terminal VOUT when the control signal EN is at the first state.

A first switch branch includes N-channel transistors 102-104 coupled in series between the VIN and VOUT terminals. A first current electrode of transistor 102 is coupled at the VIN terminal and a control electrode of transistor 102 is coupled to a first voltage supply terminal VDD. In this embodiment, a normal operating voltage is supplied at the VDD supply terminal. A second current electrode of transistor 102 is coupled to a first current electrode of transistor 104 at node N1 and a second current electrode of transistor 104 is coupled at the VOUT terminal. A control electrode of transistor 104 is coupled to receive the control signal EN.

A second switch branch includes P-channel transistors 106-108 coupled in series between the VIN and VOUT terminals. The second switch branch is coupled in parallel with the first switch branch. A first current electrode of transistor 106 is coupled at the VIN terminal and a control electrode of transistor 106 is coupled to receive a first voltage VP1 provided at an output of level shifter 120. A second current electrode of transistor 106 is coupled to a first current electrode of transistor 108 at node P1 and a second current electrode of transistor 108 is coupled at the VOUT terminal. A control electrode of transistor 108 is coupled to receive a second voltage VP2 provided at an output of level shifter 122.

P-channel transistors 110-112 are coupled at nodes N1 and P1, respectively, of the first and second branches. In this embodiment, transistors 110-112 are configured and arranged as clamp transistors to provide predetermined voltages at nodes N1 and P1 when the switch 100 is open. A first current electrode of transistor 110 is coupled at node N1 and a second current electrode is coupled at a second voltage supply terminal labeled VSS. In this embodiment, a ground voltage is supplied at the VSS supply terminal. A control electrode of transistor 110 is coupled to receive a clamp reference voltage VC provided at an output of clamp voltage generator 116. A first current electrode of transistor 112 is coupled at node P1 and a control electrode of transistor 112 is coupled to receive a third voltage VP3 provided at an output of level shifter 124. A second current electrode of transistor 112 is coupled to receive the clamp reference voltage VC provided by the clamp voltage generator 116.

Figure 4:
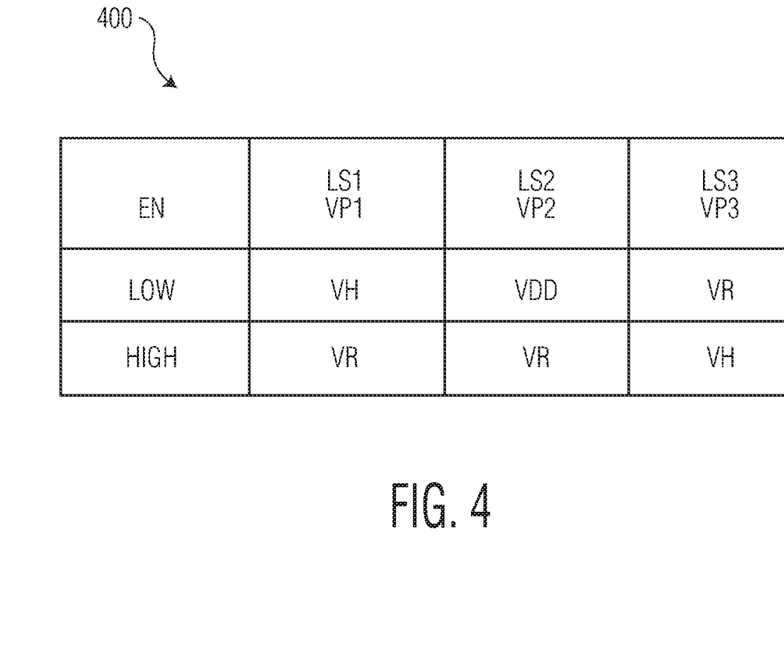
FIG. 4 illustrates, in table form, example level shifter configuration in accordance with an embodiment.

Level shifters 120-124 labeled LS1-LS3 are coupled to receive a first voltage at a first input, a second voltage at a second input, and control signal EN at a third input. In this embodiment, level shifters 120-124 are coupled to receive voltages (e.g., VH, VR) generated by level shifter voltage generator 114. The level shifter voltage generator 114 is configured and arranged to generate the VH and VR voltages based on the VIN voltage. The level shifters 120-124 are configured and arranged to provide corresponding voltages at outputs (e.g., VP1-VP3) based on the control signal EN. The table illustrated in FIG. 4 shows level shifters output values vs the control signal EN logic values.

Figure 2:
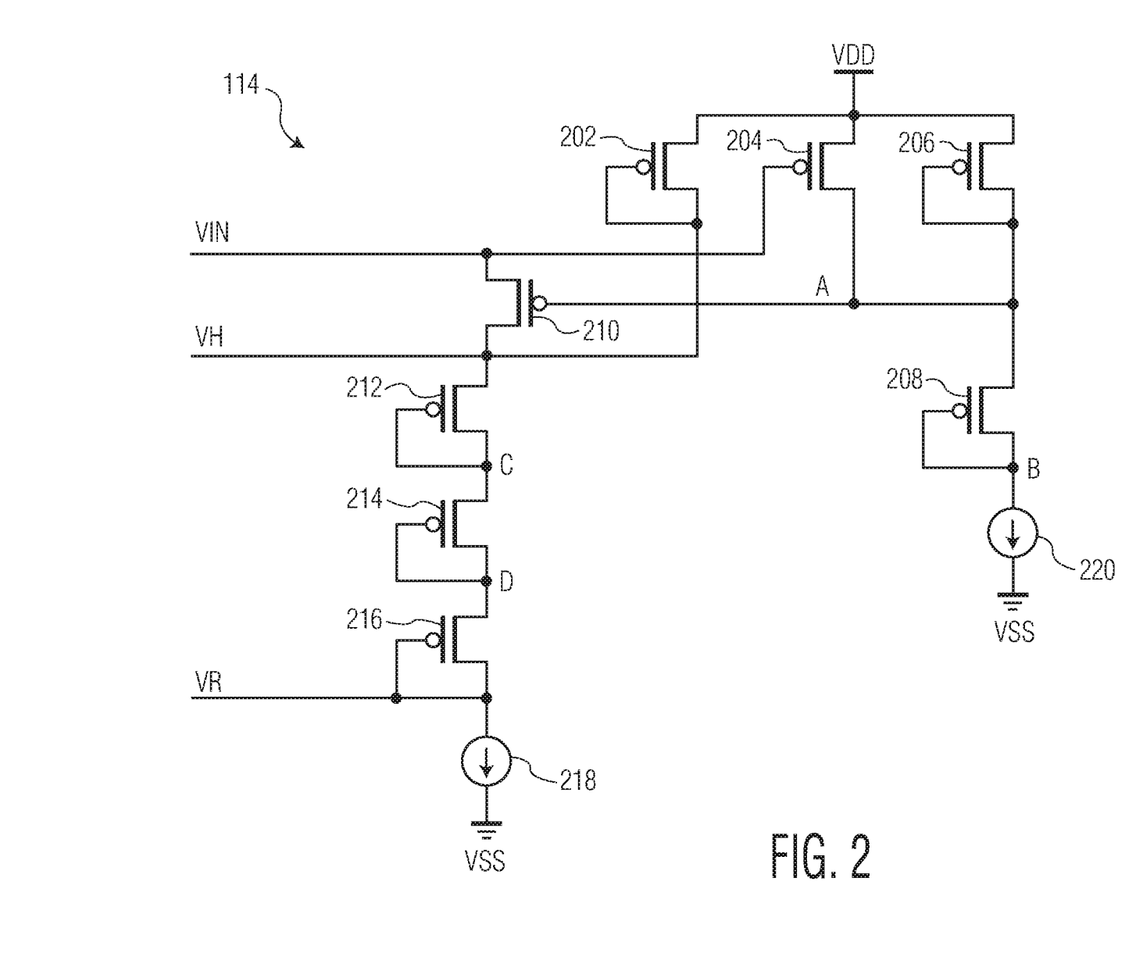
FIG. 2 illustrates, in simplified schematic diagram form, an example level shifter voltage generation circuit in accordance with an embodiment.

FIG. 2 illustrates, in simplified schematic diagram form, an example implementation of level shifter voltage generation circuit 114 in accordance with an embodiment. Voltage generation circuit 114 includes an input terminal VIN for receiving the input signal VIN, a first output terminal VH for providing the generated VH voltage, and a second output terminal for providing the generated VR voltage.

In this embodiment, voltage generation circuit 114 includes P-channel transistors 202-216 and current sources 218-220. Transistor 202 is configured as a diode. A first current electrode of transistor 202 is coupled at the VDD supply terminal and a second current electrode and a control electrode of transistor 202 are coupled at the VH terminal. A first current electrode of transistor 204 is coupled at the VDD supply terminal, a second current electrode of transistor 204 is coupled to node A, and a control electrode of transistor 204 is coupled at the VIN terminal. Transistor 206 is configured as a diode. A first current electrode of transistor 206 is coupled at the VDD supply terminal and a second current electrode and a control electrode of transistor 206 are coupled at node A. Transistor 208 is configured as a diode. A first current electrode of transistor 208 is coupled at node A and a second current electrode and a control electrode of transistor 202 are coupled to node B. A first terminal of current source 220 is coupled at node B and a second terminal of current source 220 is coupled at the VSS supply terminal.

A first current electrode of transistor 210 is coupled at the VIN terminal, a second current electrode of transistor 210 is coupled at the VH terminal, and a control electrode of transistor 210 is coupled at node A. Transistors 212-216 are configured as a series string of diodes. A first current electrode of transistor 212 is coupled at the VH terminal and a second current electrode and a control electrode of transistor 212 are coupled at node C. A first current electrode of transistor 214 is coupled at node C and a second current electrode and a control electrode of transistor 214 are coupled to node D. A first current electrode of transistor 216 is coupled at node D and a second current electrode and a control electrode of transistor 216 are coupled at the VR terminal. A first terminal of current source 218 is coupled at the VR terminal and a second terminal of current source 220 is coupled at the VSS supply terminal.

The voltage generation circuit 114 is configured and arranged to generate voltages at the VH and VR terminals based on the VIN voltage. In this embodiment, when the VIN voltage is equal to or greater than the VDD voltage, the VH voltage is approximately equal to the VIN voltage and the VR voltage is approximately equal to the VH voltage minus the gate-to-source voltages (VGS) of transistors 212-216. When the VIN voltage is less than the VDD voltage, the VH voltage is approximately equal to the VDD voltage minus the VGS of transistor 202 and the VR voltage is approximately equal to the VSS voltage. For example, with VDD=1.8 volts, VIN=3.6 volts, and each of transistors 212-216 VGS=0.6 volts, the voltage generation circuit 114 would generate VH=3.6 volts and VR=1.8 volts (e.g., VR=VH−3*VGS). In this embodiment, transistors 212-216 configured as diodes connected in series serve to step down the VH voltage by 3*VGS to generate a desired VR voltage. To generate other desired VR voltages, other numbers of transistors configured as diodes connected in series may be used.

Figure 3:
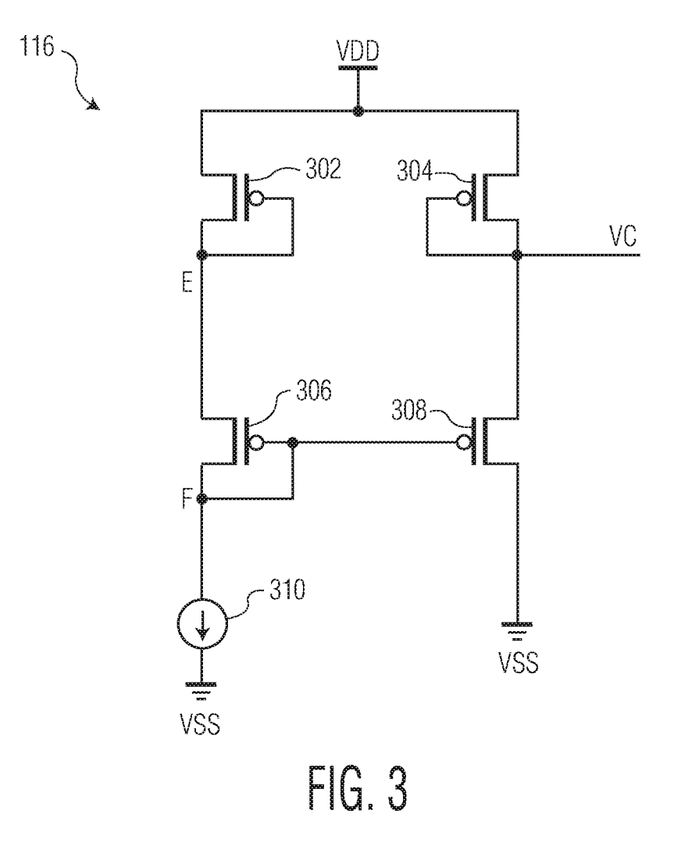
FIG. 3 illustrates, in simplified schematic diagram form, an example clamp voltage generation circuit in accordance with an embodiment.

FIG. 3 illustrates, in simplified schematic diagram form, an example clamp voltage generation circuit 116 in accordance with an embodiment. Voltage generation circuit 116 includes an output terminal providing the generated VC voltage. Referring back to FIG. 1, transistors 110-112 are configured and arranged to provide predetermined voltages at nodes N1 and P1, respectively, based on the generated VC reference voltage.

In this embodiment, voltage generation circuit 116 includes P-channel transistors 302-308 and current source 310. Transistors 302 and 304 are configured as a diodes. A first current electrode of transistor 302 is coupled at the VDD supply terminal and a second current electrode and control electrode of transistor 302 are coupled to node E. A first current electrode of transistor 304 is coupled at the VDD supply terminal and a second current electrode and control electrode of transistor 304 are coupled at the VC terminal. A first current electrode of transistor 306 is coupled at the node E and a second current electrode and control electrode of transistor 306 are coupled to node F. A first current electrode of transistor 308 is coupled at the VC terminal, a second current electrode of transistor 308 is coupled at the VSS supply terminal, and a control electrode of transistor 308 are coupled at node F. A first terminal of current source 310 is coupled at node F and a second terminal of current source 310 is coupled at the VSS supply terminal.

FIG. 4 illustrates, in table form, example level shifter configuration in accordance with an embodiment. Referring back to FIG. 1, level shifter LS1 is coupled to receive voltage signals VH and VR at respective inputs, level shifter LS2 is coupled to receive voltage signals VDD and VR at respective inputs, and level shifter LS3 is coupled to receive voltage signals VR and VH at respective inputs.

Configuration table 400 includes output voltages VP1-VP3 of respective level shifters LS1-LS3 based on the logic values (e.g., low, high) of control signal EN. A first row of configuration table 400 includes headings labeled EN for control signal EN, LS1 VP1 for the output of the first level shifter, LS2 VP2 for the output of the second level shifter, and LS3 VP3 for the output of the third level shifter. A second row of configuration table 400 includes a first logic value (e.g., LOW) for the control signal EN, corresponding output value (e.g., VH) for LS1 VP1 output, corresponding output value (e.g., VDD) for LS2 VP2 output, and corresponding output value (e.g., VR) for LS3 VP3 output of the third level shifter. For example, when the control signal is at the first logic value, the output voltage VP1 of LS1 is equal to the VH voltage, the output voltage VP2 of LS2 is equal to the VDD voltage, and the output voltage VP3 of LS3 is equal to the VR voltage. A third row of configuration table 400 includes a second logic value (e.g., HIGH) for the control signal EN, corresponding output value (e.g., VR) for LS1 VP1 output, corresponding output value (e.g., VR) for LS2 VP2 output, and corresponding output value (e.g., VH) for LS3 VP3 output of the third level shifter. For example, when the control signal is at the second logic value, the output voltage VP1 of LS1 is equal to the VR voltage, the output voltage VP2 of LS2 is equal to the VR voltage, and the output voltage VP3 of LS3 is equal to the VH voltage.

Figure 5:
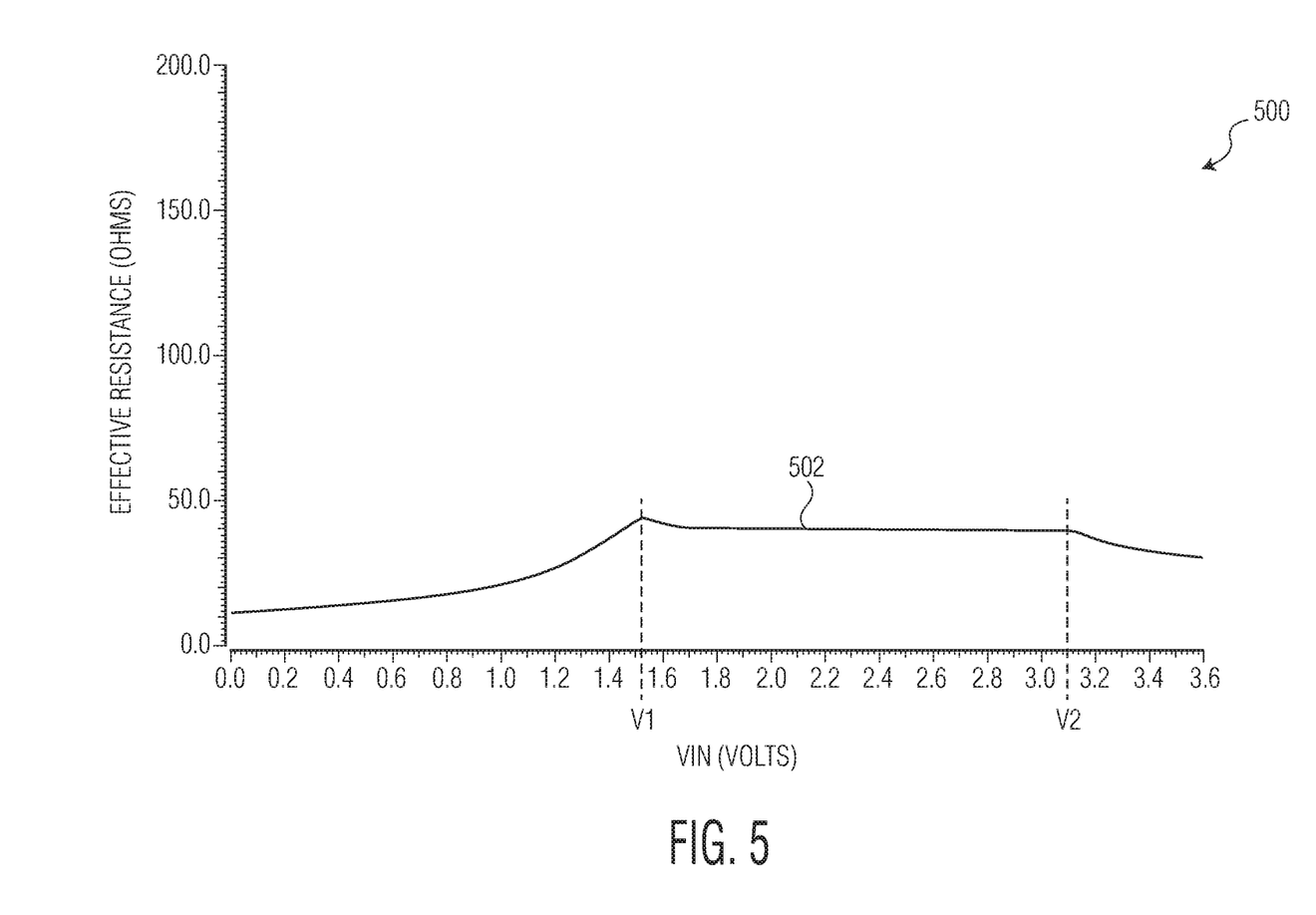
FIG. 5 illustrates, in plot diagram form, example simulation results of the analog switch circuit of FIG. 1 in accordance with an embodiment.

FIG. 5 illustrates, in plot diagram form, example simulation results of the analog switch circuit of FIG. 1 in accordance with an embodiment. The plot diagram 500 includes an effective resistance waveform 502 of the analog switch circuit 100 versus the VIN voltage. The waveform 502 is shown with resistance values in ohms on the Y-axis and VIN voltage values in volts on the X-axis.

In this embodiment, switch circuit 100 exhibits very low combined branch impedance (e.g., first and second branches connected in parallel) when VIN is swept from 0 volts to 3.6 volts (e.g., 2*VDD). At voltage V1, a peak effective resistance is shown at approximately 40 ohms where the VIN voltage approaches VDD (e.g. 1.8 volts) minus a threshold voltage (VT). The effective resistance remains relatively constant from VIN at 1.8 volts to voltage V2. At voltage V2, the effective resistance begins to decrease as transistors 106-108 in the second branch reach saturation.

Generally, there is provided, a circuit including a first branch coupled between an input terminal and an output terminal, the first branch configured and arranged to transfer an input signal at the input terminal to the output terminal when a control signal is at a first state; a first transistor in the first branch having a first current electrode coupled at the input terminal and a second current electrode coupled to a first node, the first transistor configured and arranged for receiving the input signal having a voltage exceeding a voltage rating of the first transistor; a first level shifter having an output coupled to a control electrode of the first transistor, the first level shifter configured and arranged to provide a first voltage when the control signal is at the first state, the first voltage sufficient to cause the first transistor to be conductive without exceeding the voltage rating of the first transistor; and a first voltage generator coupled to the first level shifter, the first voltage generation circuit configured and arranged to generate at a first output the first voltage based on the input signal. The circuit may further include a second transistor having a first current electrode coupled to a second current electrode of the first transistor at a first node and a second electrode coupled to receive a bias voltage. The circuit may further include a second level shifter having an output coupled to a control electrode of the second transistor, the second level shifter configured and arranged to provide a second voltage when the control signal is at the first state. The first voltage generation circuit may be further configured and arranged to generate at a second output the second voltage based on the input signal, the second voltage higher than the first voltage. The circuit may further include a second transistor having a first current electrode coupled to a second current electrode of the first transistor at the first node and a second electrode coupled at the output terminal. The circuit may further include a second level shifter having an output coupled to a control electrode of the second transistor, the second level shifter configured and arranged to provide the first voltage when the control signal is at the first state. The circuit may further include a second branch coupled in parallel with the first branch, the second branch and the first branch configured and arranged to form an analog switch, the analog switch closed when the control signal is at the first state and open when the control signal is at a second state; and a second transistor in the second branch having a first current electrode coupled at the output terminal and a control electrode coupled to receive the control signal, the second transistor configured to be conductive when the control signal is at the first state. The circuit may further include a third transistor having a first current electrode coupled to a second current electrode of the second transistor at a second node, a second current electrode coupled to a first voltage supply terminal, and a control electrode coupled to receive a bias voltage. The circuit may further include a third transistor having a first current electrode coupled to the second current electrode of the second transistor at the second node, a second current electrode coupled at the input terminal, and a control electrode coupled to a second voltage supply terminal.

In another embodiment, there is provided, a circuit including a first branch coupled between an input terminal and an output terminal; a second branch coupled in parallel with the first branch, the second branch and the first branch configured and arranged to form an analog switch, the analog switch closed when a control signal is at a first state and open when the control signal is at a second state; a first transistor in the first branch having a first current electrode coupled at the input terminal, the first transistor configured and arranged for receiving an analog signal at the input terminal having a voltage exceeding a voltage rating of the first transistor; a second transistor in the second branch having a first current electrode coupled at the output terminal and a control electrode coupled to receive the control signal, the second transistor configured to be conductive when the control signal is at the first state; and a first level shifter having an output coupled to a control electrode of the first transistor, the first level shifter configured and arranged to provide a first voltage sufficient to cause the first transistor to be conductive without exceeding the voltage rating when the control signal is at the first state. The circuit may further include a first voltage generation circuit coupled to the first level shifter, the first voltage generation circuit configured and arranged to generate at a first output the first voltage based on the analog signal. The first voltage generation circuit may be further configured and arranged to generate at a second output a second voltage based on the analog signal, the second voltage higher than the first voltage. The first level shifter may be further configured and arranged to provide the second voltage sufficient to cause the first transistor to be non-conductive when the control signal is at the second state. The circuit may further include a third transistor having a first current electrode coupled to a second current electrode of the first transistor at a first node and a second electrode coupled to receive a bias voltage; and a fourth transistor having a first current electrode coupled to a second current electrode of the second transistor at a second node and a control electrode coupled to receive the bias voltage. The circuit may further include a second voltage generation circuit coupled between a first voltage supply terminal and a second voltage supply terminal, the second voltage generation circuit configured and arranged to generate the bias voltage. The circuit may further include a third transistor having a first current electrode coupled to a second current electrode of the first transistor at a first node and a second electrode coupled at the output terminal; and a fourth transistor having a first current electrode coupled to a second current electrode of the second transistor at a second node and a second current electrode coupled at the input terminal.

In yet another embodiment, there is provided, a circuit including a first branch coupled between an input terminal and an output terminal; a first transistor in the first branch having a first current electrode coupled at the input terminal, the first transistor configured and arranged for receiving an input signal at the input terminal having a voltage exceeding a voltage rating of the first transistor; a second transistor in the first branch having a first current electrode coupled to a second current electrode of the first transistor at a first node and a second current electrode coupled at the output terminal; and a first level shifter having an output coupled to a control electrode of the first transistor, the first level shifter configured and arranged to provide a first voltage when a control signal is at a first state and a second voltage when the control signal is at a second state, the first voltage sufficient to cause the first transistor to be conductive without exceeding the voltage rating of the first transistor and the second voltage sufficient to cause the first transistor to be non-conductive. The circuit may further include a first voltage generation circuit coupled to the first level shifter, the first voltage generation circuit configured and arranged to generate at a first output the first voltage based on the input signal and at a second output a second voltage based on the input signal, the second voltage higher than the first voltage. The circuit may further include a third transistor having a first current electrode coupled at the first node and a second electrode coupled to receive a bias voltage. The circuit may further include a second branch coupled in parallel with the first branch, the second branch having one or more transistors of a conductivity type different from a conductivity type of the first and second transistors, the second branch and the first branch configured and arranged to form an analog switch, the analog switch closed when the control signal is at the first state and open when the control signal is at the second state.

By now it should be appreciated that there has been provided, an analog switch circuit with high voltage tolerance and low impedance. The analog switch is characterized as closed when a control signal is at a first logic state and open when the control signal is at a second logic state. The analog switch circuit includes a first branch of series connected N-channel transistors and a second branch of series connected P-channel transistors coupled in parallel with the first branch. A voltage generation circuit generates voltages based on the input voltage signal and in turn, the generated voltages are provided to the transistors of the second branch by way of level shifters based on the control signal. The analog switch circuit circuitry is implemented in a low-voltage process technology and accommodates an input voltage signal up to 2*VDD without exceeding a voltage rating of the transistors in the first and second branches.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
    a first branch coupled between an input terminal and an output terminal, the first branch configured and arranged to transfer an input signal at the input terminal to the output terminal when a control signal is at a first state;
    a first transistor in the first branch having a first current electrode coupled at the input terminal and a second current electrode coupled to a first node, the first transistor configured and arranged for receiving the input signal having a voltage exceeding a voltage rating of the first transistor;
    a second branch coupled in parallel with the first branch, the second branch and the first branch configured and arranged to form an analog switch, the analog switch closed when the control signal is at the first state and open when the control signal is at a second state;
    a second transistor in the second branch having a first current electrode coupled at the output terminal and a control electrode coupled to receive the control signal, the second transistor configured to be conductive when the control signal is at the first state;
    a third transistor having a first current electrode coupled to a second current electrode of the second transistor at a second node, a second current electrode coupled to a first voltage supply terminal, and a control electrode coupled to receive a bias voltage;
    a first level shifter having an output coupled to a control electrode of the first transistor, the first level shifter configured and arranged to provide a first voltage when the control signal is at the first state, the first voltage sufficient to cause the first transistor to be conductive without exceeding the voltage rating of the first transistor; and
    a first voltage generator coupled to the first level shifter, the first voltage generation circuit configured and arranged to generate at a first output the first voltage based on the input signal.

2. The circuit of claim 1, further comprising a fourth transistor having a first current electrode coupled to the second current electrode of the first transistor at the first node and a second current electrode coupled to receive the bias voltage.

3. The circuit of claim 2, further comprising a second level shifter having an output coupled to a control electrode of the fourth transistor, the second level shifter configured and arranged to provide a second voltage when the control signal is at the first state.

4. The circuit of claim 3, wherein the first voltage generation circuit is further configured and arranged to generate at a second output the second voltage based on the input signal, the second voltage higher than the first voltage.

5. The circuit of claim 1, further comprising a fourth transistor having a first current electrode coupled to the second current electrode of the first transistor at the first node and a second electrode coupled at the output terminal.

6. The circuit of claim 5, further comprising a second level shifter having an output coupled to a control electrode of the fourth transistor, the second level shifter configured and arranged to provide the first voltage when the control signal is at the first state.

7. The circuit of claim 1, further comprising a fourth transistor having a first current electrode coupled to the second current electrode of the second transistor at the second node, a second current electrode coupled at the input terminal, and a control electrode coupled to a second voltage supply terminal.

8. A circuit comprising:
a first branch coupled between an input terminal and an output terminal;
a second branch coupled in parallel with the first branch, the second branch and the first branch configured and arranged to form an analog switch, the analog switch closed when a control signal is at a first state and open when the control signal is at a second state;
a first transistor in the first branch having a first current electrode coupled at the input terminal, the first transistor configured and arranged for receiving an analog signal at the input terminal having a voltage exceeding a voltage rating of the first transistor;
a second transistor in the second branch having a first current electrode coupled at the output terminal and a control electrode coupled to receive the control signal, the second transistor configured to be conductive when the control signal is at the first state;
a first level shifter having an output coupled to a control electrode of the first transistor, the first level shifter configured and arranged to provide a first voltage sufficient to cause the first transistor to be conductive without exceeding the voltage rating when the control signal is at the first state; and
a first voltage generation circuit coupled to the first level shifter, the first voltage generation circuit configured and arranged to generate at a first output the first voltage based on the analog signal and to generate at a second output a second voltage based on the analog signal, the second voltage higher than the first voltage.

9. The circuit of claim 8, wherein the first level shifter is further configured and arranged to provide the second voltage sufficient to cause the first transistor to be non-conductive when the control signal is at the second state.

10. The circuit of claim 8, further comprising:
a third transistor having a first current electrode coupled to a second current electrode of the first transistor at a first node and a second electrode coupled to receive a bias voltage; and
a fourth transistor having a first current electrode coupled to a second current electrode of the second transistor at a second node and a control electrode coupled to receive the bias voltage.

11. The circuit of claim 10, further comprising a second voltage generation circuit coupled between a first voltage supply terminal and a second voltage supply terminal, the second voltage generation circuit configured and arranged to generate the bias voltage.

12. The circuit of claim 8, further comprising:
a third transistor having a first current electrode coupled to a second current electrode of the first transistor at a first node and a second electrode coupled at the output terminal; and
a fourth transistor having a first current electrode coupled to a second current electrode of the second transistor at a second node and a second current electrode coupled at the input terminal.

13. A circuit comprising:
a first branch coupled between an input terminal and an output terminal;
a first transistor in the first branch having a first current electrode coupled at the input terminal, the first transistor configured and arranged for receiving an input signal at the input terminal having a voltage exceeding a voltage rating of the first transistor;
a second transistor in the first branch having a first current electrode coupled to a second current electrode of the first transistor at a first node and a second current electrode coupled at the output terminal;
a third transistor having a first current electrode coupled at the first node and a second electrode coupled to receive a bias voltage; and
a first level shifter having an output coupled to a control electrode of the first transistor, the first level shifter configured and arranged to provide a first voltage when a control signal is at a first state and a second voltage when the control signal is at a second state, the first voltage sufficient to cause the first transistor to be conductive without exceeding the voltage rating of the first transistor and the second voltage sufficient to cause the first transistor to be non-conductive.

14. The circuit of claim 13, further comprising a first voltage generation circuit coupled to the first level shifter, the first voltage generation circuit configured and arranged to generate at a first output the first voltage based on the input signal and at a second output the second voltage based on the input signal, the second voltage higher than the first voltage.

15. The circuit of claim 13, further comprising a second branch coupled in parallel with the first branch, the second branch having one or more transistors of a conductivity type different from a conductivity type of the first and second transistors, the second branch and the first branch configured and arranged to form an analog switch, the analog switch closed when the control signal is at the first state and open when the control signal is at the second state.

16. A circuit comprising:
a first branch coupled between an input terminal and an output terminal;
a second branch coupled in parallel with the first branch, the second branch and the first branch configured and arranged to form an analog switch, the analog switch closed when a control signal is at a first state and open when the control signal is at a second state;
a first transistor in the first branch having a first current electrode coupled at the input terminal, the first transistor configured and arranged for receiving an analog signal at the input terminal having a voltage exceeding a voltage rating of the first transistor;
a second transistor in the second branch having a first current electrode coupled at the output terminal and a control electrode coupled to receive the control signal, the second transistor configured to be conductive when the control signal is at the first state;
a third transistor having a first current electrode coupled to a second current electrode of the first transistor at a first node and a second electrode coupled to receive a bias voltage;
a fourth transistor having a first current electrode coupled to a second current electrode of the second transistor at a second node and a control electrode coupled to receive the bias voltage; and a first level shifter having an output coupled to a control electrode of the first transistor, the first level shifter configured and arranged to provide a first voltage sufficient to cause the first transistor to be conductive without exceeding the voltage rating when the control signal is at the first state.

17. The circuit of claim 16, wherein the first level shifter is further configured and arranged to provide the second voltage sufficient to cause the first transistor to be non-conductive when the control signal is at the second state.

18. The circuit of claim 16, further comprising a voltage generation circuit coupled between a first voltage supply terminal and a second voltage supply terminal, the voltage generation circuit configured and arranged to generate the bias voltage.

19. A circuit comprising:

a first branch coupled between an input terminal and an output terminal;

a first transistor in the first branch having a first current electrode coupled at the input terminal, the first transistor configured and arranged for receiving an input signal at the input terminal having a voltage exceeding a voltage rating of the first transistor;

a second transistor in the first branch having a first current electrode coupled to a second current electrode of the first transistor at a first node and a second current electrode coupled at the output terminal; and a first level shifter having an output coupled to a control electrode of the first transistor, the first level shifter configured and arranged to provide a first voltage when a control signal is at a first state and a second voltage when the control signal is at a second state, the first voltage sufficient to cause the first transistor to be conductive without exceeding the voltage rating of the first transistor and the second voltage sufficient to cause the first transistor to be non-conductive; and a first voltage generation circuit coupled to the first level shifter, the first voltage generation circuit configured and arranged to generate at a first output the first voltage based on the input signal and at a second output the second voltage based on the input signal, the second voltage higher than the first voltage.

20. The circuit of claim 19, further comprising a second branch coupled in parallel with the first branch, the second branch having one or more transistors of a conductivity type different from a conductivity type of the first and second transistors, the second branch and the first branch configured and arranged to form an analog switch, the analog switch closed when the control signal is at the first state and open when the control signal is at the second state.

* * * * *